US008645088B2

(12) United States Patent
Schaefer et al.

(10) Patent No.: US 8,645,088 B2
(45) Date of Patent: Feb. 4, 2014

(54) SYSTEMS AND METHODS FOR DETERMINING THE STATE OF CHARGE OF A BATTERY UTILIZING CONFIDENCE VALUES

(75) Inventors: Sascha Schaefer, Selters (DE); Andreas Koenekamp, Darmstadt (DE)

(73) Assignee: GM Global Technology Operations LLC, Detroit, MI (US)

( * ) Notice: Subject to any disclaimer, the term of this patent is extended or adjusted under 35 U.S.C. 154(b) by 315 days.

(21) Appl. No.: 13/107,266

(22) Filed: May 13, 2011

(65) Prior Publication Data

US 2012/0290235 A1 Nov. 15, 2012

(51) Int. Cl.
*G01R 31/36* (2006.01)
*H02J 7/00* (2006.01)

(52) U.S. Cl.
USPC ............................................. 702/63; 320/132

(58) Field of Classification Search
USPC ............ 702/63; 320/132, 130, 124, 125, 134; 324/426, 431, 429
See application file for complete search history.

(56) References Cited

U.S. PATENT DOCUMENTS

| 6,639,385 | B2 | 10/2003 | Verbrugge et al. |
| 7,768,233 | B2 | 8/2010 | Lin et al. |
| 8,004,243 | B2 * | 8/2011 | Paryani et al. ................. 320/132 |
| 2008/0150541 | A1 * | 6/2008 | Salman et al. ................. 324/430 |
| 2009/0140742 | A1 * | 6/2009 | Koch et al. ..................... 324/426 |
| 2010/0076704 | A1 * | 3/2010 | Liu et al. .......................... 702/63 |

OTHER PUBLICATIONS

Internet Web Site: http://liionbms.com/php/wp_soc_estimate.php; accessed May 12, 2011.
Internet Web Site: http://homepages.which.net/~paul.hills/Batteries/BatteriesBody.html; accessed May 12, 2011.

\* cited by examiner

*Primary Examiner* — Marc Armand
*Assistant Examiner* — Ricky Ngon
(74) *Attorney, Agent, or Firm* — Dinsmore & Shohl LLP (57) ABSTRACT

Systems and methods to determine a state of charge (SOC) of a battery using confidence values. SOC estimations are determined using a voltage-based estimation strategy and a current-based estimation strategy. Confidence values are also generated for the voltage-based SOC estimation and the current-based SOC estimation to quantify the amount of uncertainty associated with the SOC estimations. An overall SOC estimation is determined by comparing the confidence values and selecting the SOC estimation having the least amount of uncertainty.

20 Claims, 8 Drawing Sheets

SYSTEMS AND METHODS FOR DETERMINING THE STATE OF CHARGE OF A BATTERY UTILIZING CONFIDENCE VALUES

BACKGROUND OF THE INVENTION

The present invention relates generally to determining the state of charge of a battery, and more particularly to systems and methods determining the state of charge using confidence values.

Automotive technology is rapidly expanding in the area of finding alternatives to using gasoline as the primary source of energy in vehicle propulsion systems. Many of these advances utilize either a hybrid mechanical-electrical system that recaptures some of the mechanical energy from the combustion engine as stored electrical energy, or a fully-electric propulsion system, which eliminates the need for an internal combustion engine entirely. With these advancements, the storage and management of electrical energy in vehicles has become of particular importance.

State of charge (SOC) is a commonly-used measure of the amount of charge available in a battery relative to the battery's full capacity. In automotive applications that use fully electric or hybrid-electric propulsion systems, SOC measurements provide a useful indication of the amount of energy available to propel the vehicle. Similar to the information provided by a fuel gauge, a state of charge measurement can provide a driver of an electric vehicle with an indication of how long the vehicle may travel before running out of energy.

Traditional estimations of the SOC of a battery fall into two general categories: voltage-based approaches and current-based approaches. Voltage-based approaches typically make use of the mostly nonlinear relationship between the battery's voltage and state of charge. Measurement of a battery's voltage and knowledge of the battery's voltage-SOC profile can therefore be used to determine the present state of charge of the battery. Current-based approaches, in contrast, estimate the SOC of the battery by tracking the amount of current into and out of the battery. Integration of current measurements taken from the battery corresponds to the amount of charge that has either entered the battery or left the battery during a given span of time, leading to these techniques sometimes being referred to as "Coulomb-counting" techniques.

Voltage-based techniques suffer from a number of potential sources of error. The measured voltage of a battery is dependent on a number of factors including the temperature of the battery and the rest time of the battery relative to the battery's diffusion time constant. Another potential source of error exists for batteries that exhibit nearly flat voltage-SOC characteristics, such as with lithium-based batteries. For these types of batteries, the change in the battery's voltage with its state of charge may be very slight, making any uncertainty in the voltage measurement another potential source of error. Therefore, the tolerance of the voltage sensor itself may also be a significant source of error, for voltage-based SOC estimates.

Current-based techniques also suffer from a number of potential sources of error. A first potential problem with current-based techniques is that they rely on comparing the amount of charge into or out of the battery to an initial measurement. Therefore, inaccuracies in the initial measurement can present one potential source of error for the SOC estimate. A second potential source of error results from integrating the current readings: over time, any small amount of error present in the measurements becomes magnified by the integration process. For example, the tolerance of the current sensor may contribute to a difference between the measured and actual battery currents. This difference may continue to grow via the integration process, leading to an increasingly inaccurate estimation of the SOC over time. A third potential source of error is the battery's reference capacity itself, which depends on the temperature and lifetime of the battery. This value must be estimated, introducing additional sources of error. For example, U.S. patent application Ser. No. 13/107,171 filed May 13, 2011 entitled "SYSTEMS AND METHODS FOR DETERMINING CELL CAPACITY VALUES IN A MULTI-CELL BATTERY" discloses such an estimation technique and is assigned to the assignee of the present invention, the entirety of which is hereby incorporated by reference.

Recent efforts have been made to combine voltage-based and current-based techniques. For example, a voltage-based technique may be used when the SOC nears zero or one hundred percent, i.e., the battery is nearly empty or nearly full. When the SOC of the battery lies in the midrange, for example, between 20-90%, a current-based technique may be used to estimate the SOC. However, such a hybrid approach still suffers from the potential inaccuracies present when using either voltage-based or current-based techniques.

SUMMARY OF THE PRESENT INVENTION

In one embodiment, a method for determining a state of charge of a vehicle battery is disclosed. The method includes receiving, at a processor, sensor data indicative of a voltage, current, and temperature of the battery. The method also includes determining a first state of charge value using a voltage-based strategy on the sensor data. The method further includes calculating a first confidence value for the first state of charge value. The method yet further includes determining a second state of charge value using a current-based strategy on the sensor data. The method also includes calculating a second confidence value for the second state of charge value and comparing the first confidence value and second confidence value. The method further includes selecting between the first state of charge value and the second state of charge value based on the comparison. The method additionally includes storing the selected state of charge value in a memory as an overall state of charge value.

In another embodiment, a system for determining a state of charge of a vehicle is disclosed. The system includes an interface configured to receive sensor data from a voltage sensor, a current sensor, and a temperature sensor connected to the battery. The system also includes a voltage-based state of charge generator configured to generate a first state of charge value using a voltage-based strategy on the sensor data. The system additionally includes a voltage-based confidence value generator configured to calculate a first confidence value for the first state of charge value. The system further includes a current-based state of charge generator configured to generate a second state of charge value using a current-accumulation strategy on the sensor data. The system also includes a current-based confidence value generator configured to calculate a second confidence value for the second state of charge value. The system yet further includes a confidence value evaluator configured to compare the first confidence value and second confidence value. The system additionally includes a state of charge storage configured to store the first or the second state of charge value as an overall state of charge value, based on the comparison.

In another embodiment, a system for determining a state of charge of a vehicle battery is disclosed. The system includes a vehicle battery and temperature, current, and voltage sensors configured to measure the temperature, current and voltage of the battery, respectively. The system also includes a memory storing one or more state of charge values for the battery. The system further includes a processor coupled to the memory and configured to receive sensor data from the sensors indicative of a voltage, current, and temperature of the battery. The processor is also configured to determine a first state of charge value using a voltage-based strategy on the sensor data. The processor is further configured to calculate a first confidence value for the first state of charge value. The processor is additionally configured to determine a second state of charge value using a current-based strategy on the sensor data. The processor is also configured to calculate a second confidence value for the second state of charge value. The processor is further configured to compare the first confidence value and second confidence value. The processor is yet further configured to select between the first state of charge value and the second state of charge value based on the comparison. The processor is additionally configured to store the selected state of charge value in the memory as an overall state of charge value.

BRIEF DESCRIPTION OF THE DRAWINGS

The following detailed description of specific embodiments can be best understood when read in conjunction with the following drawings, where like structure is indicated with like reference numerals and in which.

The embodiments set forth in the drawings are illustrative in nature and are not intended to be limiting of the embodiments defined by the claims. Moreover, individual aspects of the drawings and the embodiments will be more fully apparent and understood in view of the detailed description that follows.

DETAILED DESCRIPTION OF THE PREFERRED EMBODIMENTS

As stated above, present techniques to determine a state of charge (SOC) for a battery are generally categorized as being voltage-based or current-based, examples of which are described in greater detail in U.S. Pat. No. 6,639,385 to Verbrugge et al., which is hereby incorporated by reference. Confidence values, according to an aspect of the present invention, allow a hybrid approach to be taken that utilizes both voltage-based and current-based techniques to calculate the state of charge. Such a hybrid approach allows a more accurate calculation of the SOC of a battery at all times, since SOC estimations determined by different techniques are constantly compared among one another.

Figure 1:
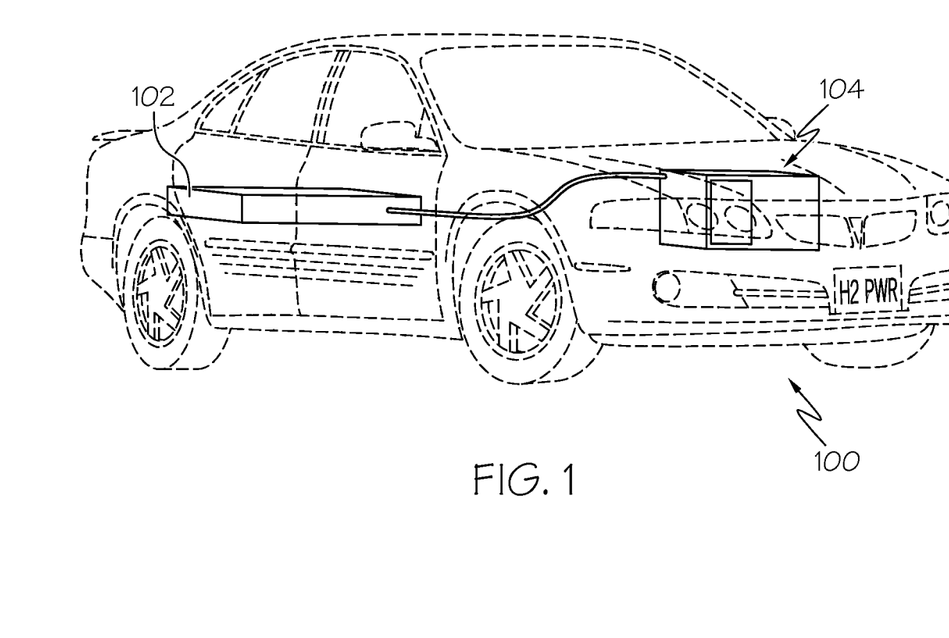
FIG. 1 is a schematic illustration of a vehicle having a battery cell.

Referring now to FIG. 1, vehicle 100 is shown, according to an exemplary embodiment. Vehicle 100 includes battery 102 which provides electrical power to propel vehicle 100 using either a hybrid-electric or a fully-electric propulsion system. Battery 102 may be a single battery cell, multiple battery cells, or a collection of discrete batteries working in conjunction to provide propulsion power to vehicle 100. Vehicle 100 also includes vehicle controller 104. Vehicle controller 104 is operatively connected to battery 102 and provides monitoring and control over the operation of battery 102. Vehicle controller 104 may also monitor or control one or more other functions of the vehicle. For example, vehicle controller 104 may provide information about the operational state of battery 102 to an electronic display within vehicle 100 to convey the information to the vehicle's driver. Vehicle controller 104 may also provide control over other systems of vehicle 100. For example, vehicle controller 104 may control the operations of the engine, the electrical system, or the exhaust system of vehicle 100.

Vehicle controller 104 may include any number of hardware and software components. For example, vehicle controller 104 may include a microprocessor, an application-specific integrated circuit (ASIC), or a field-programmable gate array (FPGA). Vehicle controller 104 may also include machine instructions stored within a memory device in vehicle controller 104 which are capable of implementing one or more monitoring or control functions when executed by vehicle controller 104. For example, vehicle controller 104 may include one or more non-transitory memory devices such as a RAM, ROM, EEPROM, flash memory, or any other memory capable of storing the machine instructions for vehicle controller 104.

Voltage-Based SOC Estimation

Figure 2:
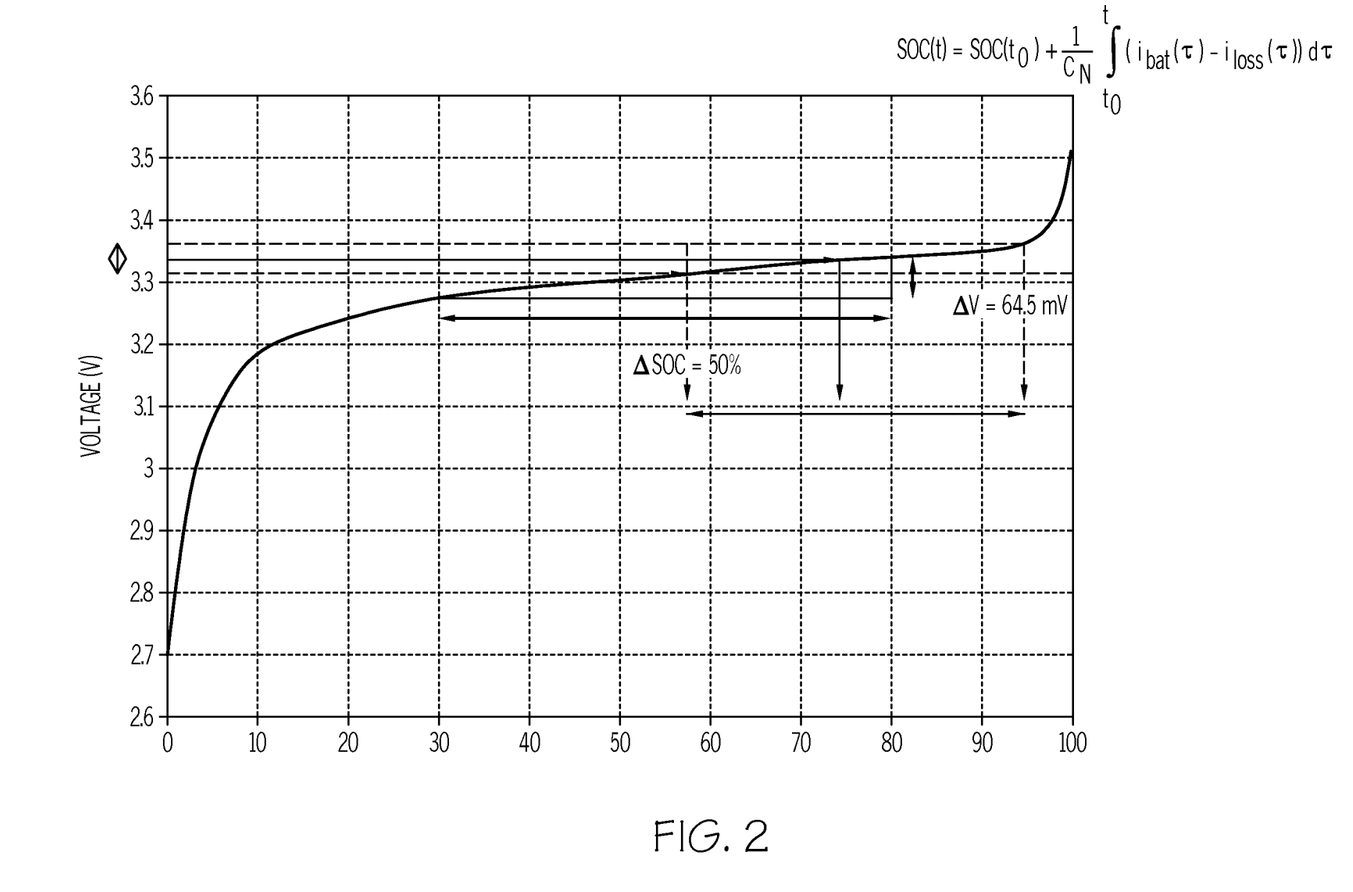
FIG. 2 is a plot of the open circuit voltage of a LiFePO$_4$ battery cell as a function of its state of charge.

Referring now to FIG. 2, a plot of the open circuit voltage for a LiFeO$_4$ battery cell is shown as a function of the battery's SOC. In the midrange for the SOC, the open circuit voltage for the battery changes very little, leading to potential error in any SOC estimations based on voltage measurements of the battery. For example, the tolerance of the voltage sensor providing the measurements may contribute to the overall uncertainty of the actual voltage of the battery. As a further consideration, the voltage-SOC relationship is also dependent on the temperature of the battery, the rest time for the battery (e.g., when the battery is not providing or receiving charge), and the diffusion constant of the battery.

Several voltage-based techniques exist to estimate the SOC of the battery using a measured voltage. For example, an estimation of the SOC may be made by comparing a raw open circuit voltage value to a known voltage-SOC relationship. In other techniques, linear regression may be used to determine the SOC. For example, U.S. Pat. No. 7,768,233 to Lin, et al., which is also hereby incorporated by reference, discloses using an equivalent circuit model and regression techniques to determine the open circuit voltage and estimate SOC values.

A confidence value between the SOC estimation using a voltage-based technique (SOC$_v$) and the actual SOC for the battery (SOC$_{real}$) can be determined using the following:

$$\Delta SOC_v = f(V_{tol}, T, t_{rest}, \tau)$$

where $\Delta SOC_v$ is the estimated range of variation for SOC$_v$, $V_{tol}$ is the tolerance of the voltage sensor, T is the temperature of the battery, $t_{rest}$ is the rest time of the battery, and τ is the diffusion time constant of the battery. When the battery is in a rest state (e.g., no charge is being drawn from, or added to, the battery), diffusion effects may still be present in the battery, leading to further uncertainty in the calculated open-circuit voltage for the battery, in addition to the voltage sensor's tolerance. It will be appreciated by those skilled in the art that the amount of time needed to overcome the influence of diffusion effects depends on the temperature of the battery and the diffusion constant for the battery. If the battery has been at a state of rest for a sufficient amount of time to overcome the effects of diffusion, $\Delta SOC_v$ is strictly a function of the tolerance of the voltage sensor. However, if an insufficient amount of rest time has elapsed to overcome the effects of diffusion, $f(T, t_{rest}, \tau)$ may be greater than zero, thereby adding to the range of uncertainty for $SOC_v$. Therefore, the amount of contribution of $f(T, t_{rest}, \tau)$ to $\Delta SOC_v$ decreases over time when the battery is at rest. By way of example, $\Delta SOC_v$ may decrease from 5% to 2% over the course of time, as the effects of diffusion on the battery decrease. Adding and subtracting $\Delta SOC_v$ to $SOC_v$ then provides an estimated range in which $SOC_{real}$ lies. The function f is derived from the Voc-SOC profile shown in FIG. 2.

When the battery is not at rest, $\Delta SOC_v$ may be a pure function of the tolerance of the voltage sensor or may also include additional considerations. For example, if the open circuit voltage of the battery is estimated during battery operation using an equivalent circuit model and a linear regression technique, the excitation level of the regression algorithm and/or noise in the discretization process may also be added to the voltage sensor's tolerance.

In an alternate embodiment, separate $\Delta SOC_v$ values may be calculated above and below the $SOC_v$ estimate (not shown). For example, $\Delta SOC_{v\_1}$ may define the uncertainty above $SOC_v$ and $\Delta SOC_{v\_2}$ may define the uncertainty below $SOC_v$. Adding $\Delta SOC_{v\_1}$ to $SOC_v$ and subtracting $\Delta SOC_{v\_2}$ from $SOC_v$ may then provide an asymmetrical range, if $\Delta SOC_{v\_1}$ and $\Delta SOC_{v\_2}$ differ.

Current-Based SOC Estimation

Current-based SOC estimation techniques generally operate by integrating current measurements over time to determine the amount of charge that has entered and left the battery. For example, the following equation can be used to estimate the SOC for a battery:

$$SOC_i(t) = SOC_i(t_0) + \frac{1}{C_{bat}} \int_{t0}^{t} (i_{bat}(t)) dt$$

where $SOC_i(t_0)$ is an initial SOC estimation at starting time $t_0$, $C_{bat}$ is the battery's capacity in Ampere-hours, and $i_{bat}(t)$ is the battery current at time t.

In digital systems, the integration calculation may be approximated. For example, the following calculation may be used to determine the state of charge:

$$SOC_i(k) = SOC_i(k-1) + \frac{1}{C_{bat}} * i_{bat} * \frac{\Delta t}{3600}$$

where $i_{bat}$ is the measured current, $C_{bat}$ is the battery's capacity, $SOC_i(k-1)$ is the previously calculated state of charge, and $\Delta t$ is the elapse of time between the previous and current measurement of $i_{bat}$.

This technique gives way to three potential sources of error. First, $SOC_i(0)$, the initial estimation of $SOC_i$, must be accurate. If not, any deviation between $SOC_i(0)$ and $SOC_{real}(0)$ will also be present in future $SOC_i$ estimations. The second potential source of error is due to potential inaccuracies in $i_{bat}(t)$. For example, any uncertainty in the measured value of $i_{bat}$ due to the tolerance of the current sensor will become magnified over time. The third source of error is due to the battery's reference capacity $C_{bat}$, which also must be estimated. In some embodiments, a confidence range $\Delta C_{bat}$ may also be determined to quantify the amount of error associated with this estimation. Using the tolerance of the current sensor and/or the tolerance of the estimated capacity, a confidence value can be calculated for the current-based state of charge estimation. For example, a confidence value $\Delta SOC(k)$ can be calculated as follows:

$$\Delta SOC(k) = \Delta SOC(k-1) + \frac{1}{C_{bat}} * i_{tol} * \frac{\Delta t}{3600} + \left| -\frac{Q}{C_{bat}^2} \right| |\Delta C_{bat}|$$

where $i_{tol}$ is the tolerance of the current sensor, $C_{bat}$ is the battery's capacity, $\Delta SOC(k-1)$ is the previously calculated confidence value, Q is the accumulated charge since the last initialization, $\Delta C_{bat}$ is the tolerance of the battery's capacity and $\Delta t$ is the amount of time between calculations of the confidence values. Adding and subtracting $\Delta SOC_i$ to $SOC_i$ then provides an estimated range in which $SO_{real}$ lies. Additional factors may also be included in the computation of $\Delta SOC(k)$. For example, if the current is estimated during battery operation using a linear regression technique, the excitation level of the regression algorithm may also be included. In another example, the amount of noise in the discretization process from the current measurement may be added to the current sensor's tolerance.

Figure 3:
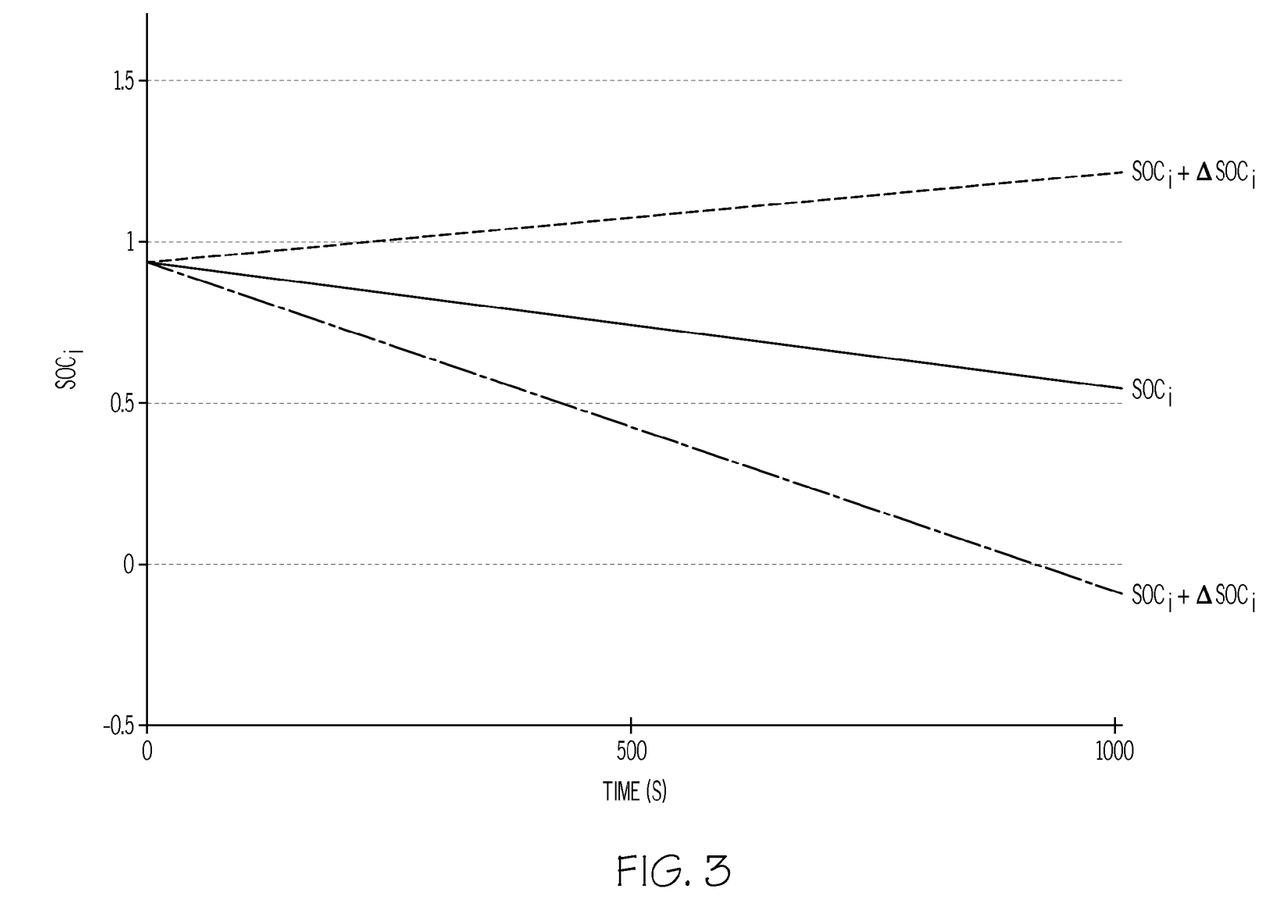
FIG. 3 is a plot of a current-based SOC estimate as a function of time.

Referring now to FIG. 3, a plot of $SOC_i$ as a function of time is shown, according to an exemplary embodiment. Also shown in FIG. 3 are the plots of $SOC_i +/- \Delta SOC_i$, which corresponds to the range of values in which $SOC_{real}$ may lie. As time increases, so does $\Delta SOC_i$, indicating a decrease in the certainty that $SOC_i$ corresponds to $SOC_{real}$.

In an alternate embodiment, separate $\Delta SOC_i$ values may be calculated above and below the $SOC_i$ estimate. For example, $\Delta SOC_{i\_1}$ may define the uncertainty above $SOC_i$ and $\Delta SOC_{i\_2}$ may define the uncertainty below $SOC_i$. Adding $\Delta SOC_{i\_1}$ to $SOC_i$ and subtracting $\Delta SOC_{i\_2}$ from $SOC_i$ may then provide an asymmetrical confidence range, if $\Delta SOC_{i\_1}$ and $\Delta SOC_{i\_2}$ differ.

Hybrid SOC Estimation

Figure 4:
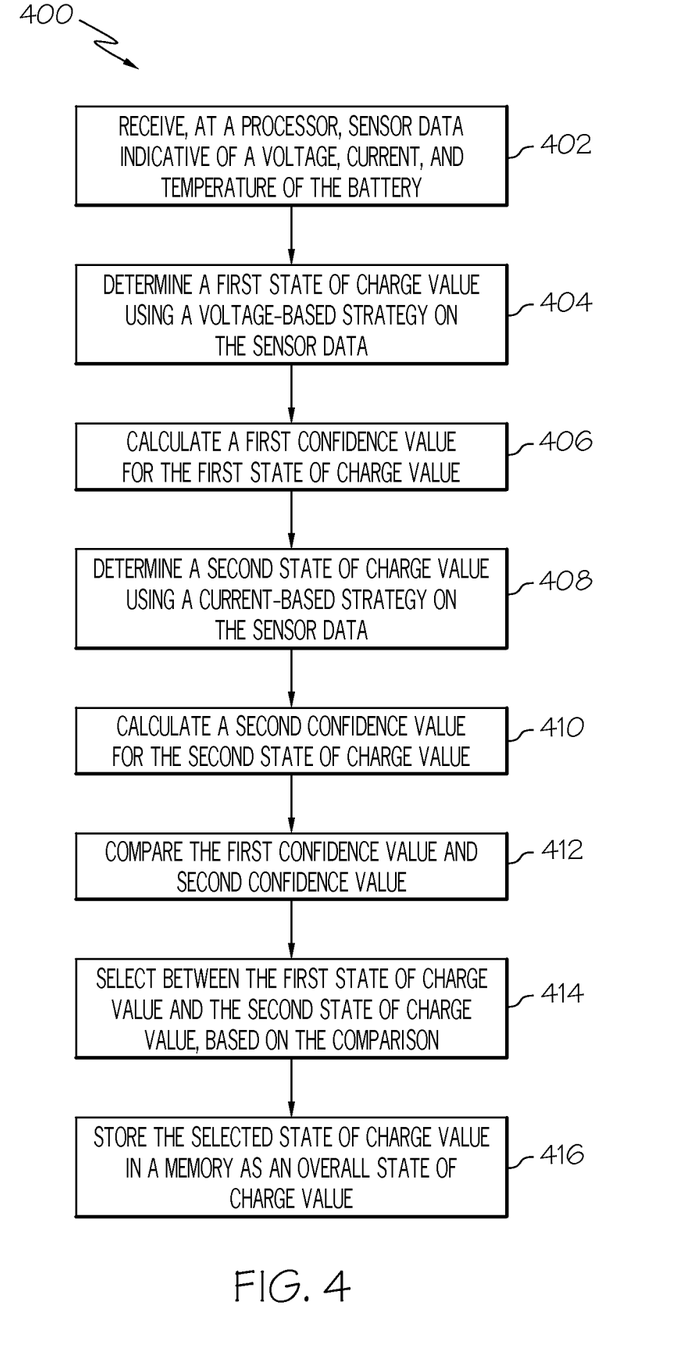
FIG. 4 shows a method for calculating a state of charge of a battery, according an aspect of the present invention.

Referring now to FIG. 4, method 400 for calculating a state of charge is shown, according to an exemplary embodiment. Method 400 utilizes a hybrid approach that includes both voltage-based and current-based SOC estimations. Method 400 is shown to include step 402, where sensor data indicative of a voltage, current, and temperature of a battery are received at a processor. At step 404, a first state of charge value is determined using a voltage-based strategy on the sensor data. For example, an open circuit voltage maybe determined by using the measured battery voltage after a sufficient rest time. This open circuit voltage can then be compared against a voltage-SOC characteristic for the battery to determine a first SOC value. Such a characteristic may be stored within the memory of the processor or in a look-up table (LUT). In other embodiments, the voltage-based strategy may be using an equivalent circuit model for the battery and utilize linear regression to determine the open circuit voltage.

At step 406, a first confidence value is calculated for the first state of charge value. The confidence value may be calculated using the tolerance of the voltage sensor providing the voltage data. The confidence value may also account for the amount of rest time necessary for diffusion effects to subside in the battery by comparing the rest time, temperature data, and diffusion constant for the battery. Where diffusion effects are still present in the battery, the confidence value may be increased beyond just the uncertainty attributable to the tolerance of the voltage sensor. In other embodiments, additional factors may be included such as the amount of noise in the discretization of the voltage data measurements from the voltage sensor or, if linear regression is used to compute the first SOC value, the excitation level of the regression algorithm.

At step 408, a second state of charge value is determined using a current-based strategy on the sensor data. For example, the current data from the current sensor can be integrated to determine the amount of charge that has entered or left the battery over a period of time. This difference in charge can then be used in combination with an initial SOC estimation to determine the second SOC value.

At step 410, a second confidence value for the second state of charge value is calculated. The confidence value may be calculated using the tolerance of the current sensor and may also account for the amount of noise in the discretization of the voltage data measurements from the voltage sensor. Also a tolerance value from the capacity estimation may be taken into account.

At step 412, the first and second confidence values are compared. For example, where the confidence values are both positive numbers, the difference between the two values can be calculated to determine which value is greater. In such a case, the smaller of the two confidence values corresponds to the SOC estimation having the lesser amount of uncertainty.

At step 414, based on a comparison of confidence values, a selection is made between the first and second SOC values to select the SOC estimation having the least amount of uncertainty. In this way, the SOC estimation using the voltage-based strategy is compared to the SOC estimation using the current-based strategy. At step 416, the SOC estimation that has the lower amount of uncertainty is selected as the best value currently available. If this value differs less than a certain number from the stored overall state of charge value then the selected SOC value is stored directly in a memory as an overall state of charge value. However, if the selected SOC differs more than a certain number from the stored overall state of charge, a particular method is used to perform a smooth transition from the old to the new overall state of charge value that is then stored in the memory. For this transition filtering, closed-loop control or rate limiter techniques can be applied, according to various embodiments.

Figure 5:
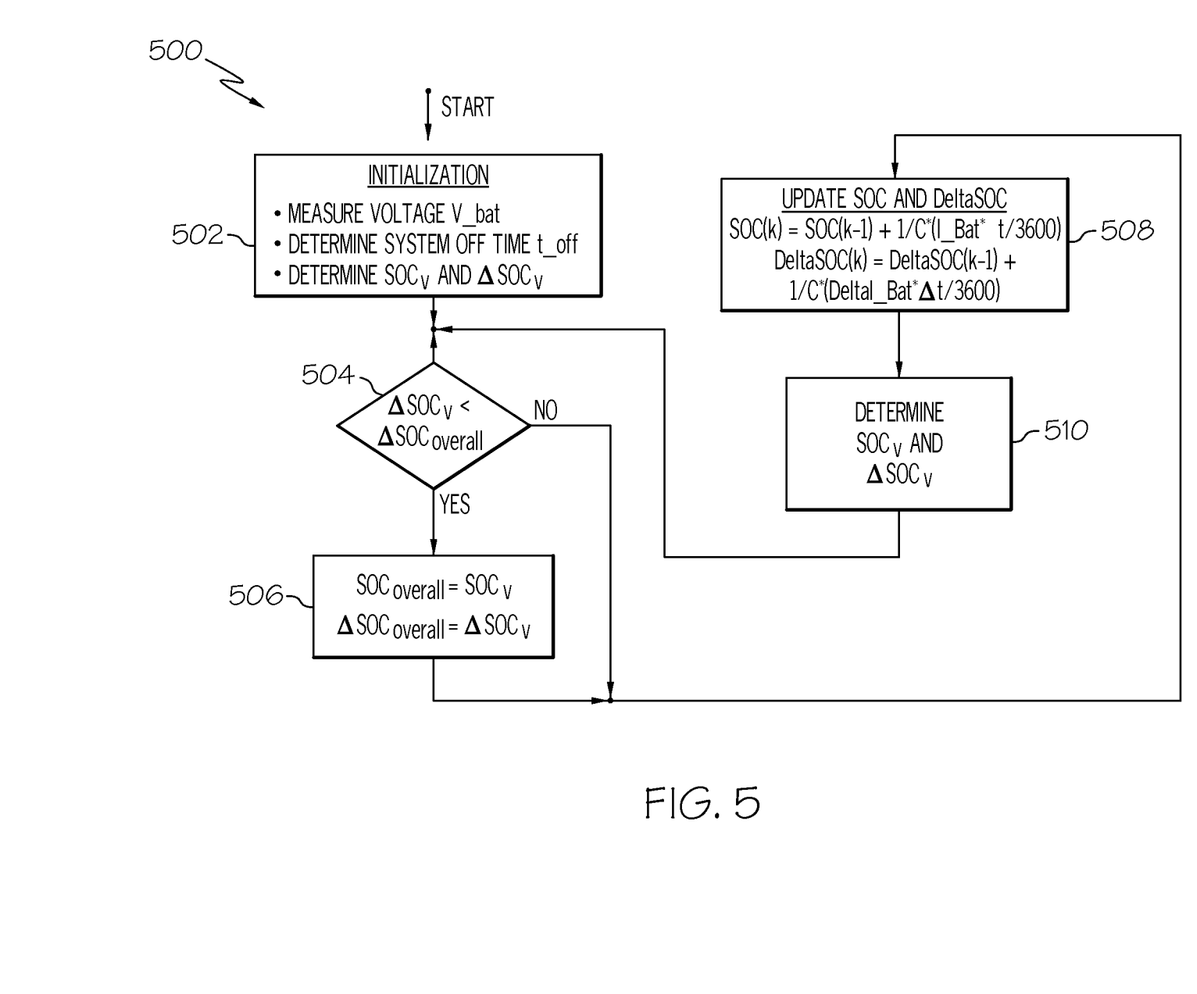
FIG. 5 shows a second method for calculating a state of charge of a battery, according to an aspect of the present invention.

Referring now to FIG. 5, method 500 for determining an overall state of charge of a battery is shown, according to an exemplary embodiment. Method 500 utilizes a hybrid approach using both voltage-based and current-based SOC estimations. Under this approach, current-based SOC estimations are utilized as the overall SOC by default, unless the voltage-based SOC estimation has a lower amount of uncertainty. In such a case, the overall SOC estimation is reset to the voltage-based SOC estimation and the current-based approach continues.

At step 502, a processor utilizes a voltage-based strategy to estimate $SOC_v(k)$ and a confidence value, $\Delta SOC_v(k)$, in order to initialize the system. For example, initialization may be required when the vehicle is restarted after a period of rest, at periodic intervals required by system parameters, or required in response to receiving manual input from a user input device. During initialization, $\Delta SOC_v(k)$, may be calculated using $$\Delta SOC_v(k) = f(V_{tol}, T, t_{rest}, \tau)$$

where $\Delta SOC_v(k)$ is the estimated range of variation for $SOC_v(k)$, $V_{tol}$ is the tolerance of the voltage sensor, T is the temperature of the battery, $t_{rest}$ is the rest time of the battery, and $\tau$ is the diffusion time constant of the battery. In other embodiments, $\Delta SOC_v(k)$ may also include other factors such as the discretization noise or the excitation level of a linear regression algorithm, $SOC_v$ is determined using regression. The function f is derived from the Voc-SOC profile shown in FIG. 2.

At step 504, $\Delta SOC_v(k)$ is compared to a previously stored confidence value $\Delta SOC_{overall}(k-1)$, which corresponds to the confidence in the most recent $SOC_{overall}(k-1)$ estimation. Such a comparison allows the processor to leverage both the voltage-based and current-based SOC estimation strategies by determining which SOC estimation has the least amount of uncertainty.

The comparison at step 504 serves two distinct functions. First, current-based approaches generally require an accurate starting SOC estimation. After initialization of the system, if $\Delta SOC_v(k)$ is less than $\Delta SOC_{overall}(k-1)$, $SOC_v(k)$ may be used as the starting SOC estimation for the current-based strategy. Second, current-based SOC estimations tend to drift away from the actual SOC over time due to their use of integration techniques. Where the system has been running for a period of time and $\Delta SOC_v(k)$ is less than $\Delta SOC_{overall}(k-1)$, this may indicate that the current-based $SOC_{overall}(k-1)$ should be reset to $\Delta SOC_v(k)$.

In an alternative embodiment, asymmetric confidence ranges may be used in place of $\Delta SOC_v(k)$ and $\Delta SOC_{overall}(k-1)$. In such a case, the overlap of the confidence ranges has to be evaluated to derive $SOC_{overall}(k)$ and $\Delta SOC_{overall}(k)$.

At step 506, if $\Delta SOC_v(k)$ is less than $\Delta SOC_{overall}(k-1)$, $SOC_{overall}(k-1)$ is set to be equal to $SOC_v(k)$ or the said techniques are applied (see [0031]). Doing so ensures that the SOC estimation with the least amount of uncertainty is always used in future current-based calculations. If $SOC_{overall}(k-1)$ is reset to be equal to the voltage-based estimation $SOC_v(k)$, $\Delta SOC_{overall}(k-1)$ is also reset to be equal to $\Delta SOC_v(k)$, to indicate the corresponding change in the amount of uncertainty in the overall SOC estimation.

At step 508, a current-based SOC estimation strategy is used to determine the next overall SOC estimation, $SOC_{overall}(k)$. For example, $SOC_{overall}(k)$ may be estimated using:

$$SOC_{overall}(k) = SOC_{overall}(k-1) + \frac{1}{C_{bat}} * i_{bat} * \frac{\Delta t}{3600}$$

where $i_{bat}$ is the measured current, $C_{bat}$ is the battery's capacity, $SOC_{overall}(k-1)$ is the previously calculated overall state of charge value, and $\Delta t$ is the elapse of time between the previous and current measurement of $i_{bat}$. One skilled in the art would appreciate that any number of current-based estimations may be used to calculate $SOC_{overall}(k)$.

At step 508, the confidence value $\Delta SOC_{overall}(k)$ is also calculated. For example, $\Delta SOC_{overall}(k)$ may be determined using the following:

$$\Delta SOC_{overall}(k) = \Delta SOC_{overall}(k-1) + \frac{1}{C_{bat}} * i_{tol} * \frac{\Delta t}{3600}$$

where $i_{tol}$ is the tolerance of the current sensor, $C_{bat}$ is the battery's capacity, $\Delta SOC_{overall}(k-1)$ is the previously calculated confidence value and $\Delta t$ is the amount of time between calculations of the confidence values. In alternative embodiments, separate confidence values may be determined to define an asymmetric confidence range above and below $SOC_{overall}(k)$. Such a range corresponds to the range of values most likely to include the actual SOC of the battery. A smaller range, therefore, indicates less uncertainty between the estimated SOC value and the actual SOC of the battery.

At step 510, a voltage-based strategy is used to determine $SOC_v(k)$, when the system is running (e.g., after initialization). For example, a voltage-based regression technique may be used to determine $SOC_v(k)$, as disclosed in aforementioned U.S. Pat. No. 7,768,233 to Lin, et al., and in the book, "Identification of Dynamical Systems," by Rolf Isermann and Marco Münchhof, which is also hereby incorporated by reference. In such techniques, regression analysis may be used to determine the open-circuit voltage for the battery. For example, a lithium ion battery may be modeled by the difference equation:

$$V(k) = -a_1 V(k-1) - a_2 V(k-2) + b_0 I(k) + b_1 I(k-1) + b_2 I(k-2) + (1+a_1+a_2) V_{oc}$$

where V refers to voltage measurements taken at times k, k−1, and k−2, I refers to current measurements taken at times k, k−1, and k−2, $V_{oc}$ is the open-circuit voltage, and $a_i$ and $b_i$ are constants.

Using a difference equation to model the battery allows calculation of the open circuit voltage, $V_{oc}$, to be determined using voltage and current measurements from the battery. As noted previously, the open circuit voltage of a battery is related to its state of charge, thereby allowing $SOC_v(k)$ to also be estimated. For example, known $V_{oc}$-SOC relationships may be stored in a lookup table or other non-tangible memory device and used to estimate $SOC_v(k)$.

Similarly, the confidence value $\Delta SOC_v(k)$ may be used to denote the amount of uncertainty in the determination of $V_{oc}(k)$. For example, sources of uncertainty in the estimated open-circuit voltage may include the tolerance of the voltage sensor, the tolerance of the current sensor, the amount of noise in the discretization process, or the excitation level of the regression technique. By way of example only, if the tolerance of the voltage sensor is 3%, the corresponding effect of this variation on the estimated $V_{oc}(k)$ may be determined and used to compute $\Delta SOC_v(k)$ by application of the Voc-SOC characteristic shown in FIG. 2.

During normal operation of the system (e.g., after initialization), $SOC_{overall}(k)$, is determined in step 508, using a current-based strategy. However, the confidence value $\Delta SOC_{overall}(k)$ is also compared to $\Delta SOC_v(k)$ in step 504 to determine if the current-based SOC estimation has drifted over time. If the amount of uncertainty for the current-based estimation surpasses that of the voltage-based estimation, the system resets $SOC_{overall}(k)$ using the voltage-based estimation and resets $\Delta SOC_{overall}(k)$ using the voltage-based confidence value by applying an appropriate method as described previously.

Figure 6:
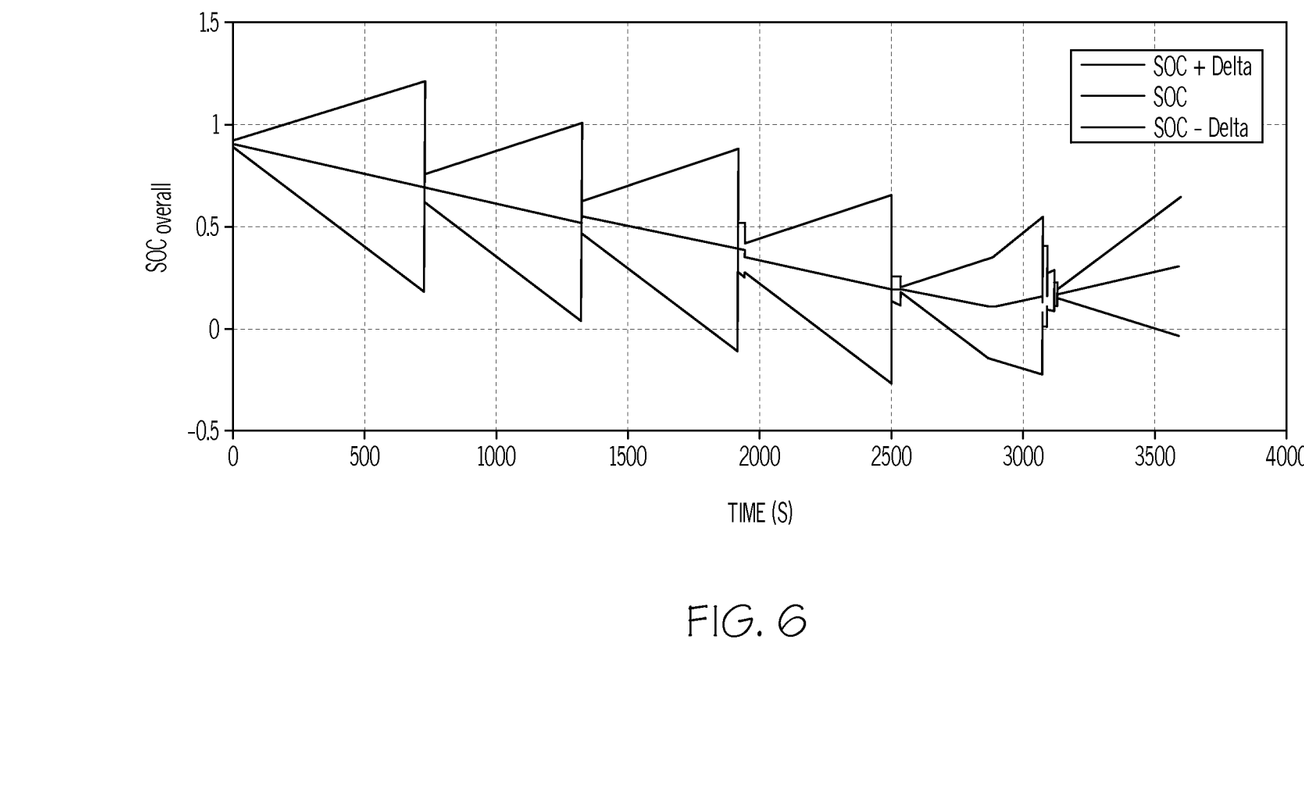
FIG. 6 is a plot of an SOC estimation determined by the method of FIG. 5 as a function of time.

Referring now to FIG. 6, a plot of an SOC estimation determined by the method of FIG. 5 is shown as a function of time, according to an exemplary embodiment. As shown, the confidence value for the SOC estimation (e.g., "Delta") is added and subtracted to the SOC estimation (e.g., $SOC_{overall}$) to define a range of values in which the actual SOC is likely to lie. As time progresses, the current-based estimation begins to drift due to uncertainty in the system. At times where the voltage-based estimation has less uncertainty, $SOC_{overall}$ is reset to $SOC_v$ and the current-based strategy continues to be used. $\Delta SOC_{overall}$ is also reset to $\Delta SOC_v$ to reflect that the updated overall SOC estimation now has a higher amount of certainty that it is close to the actual state of charge of the battery.

Figure 7:
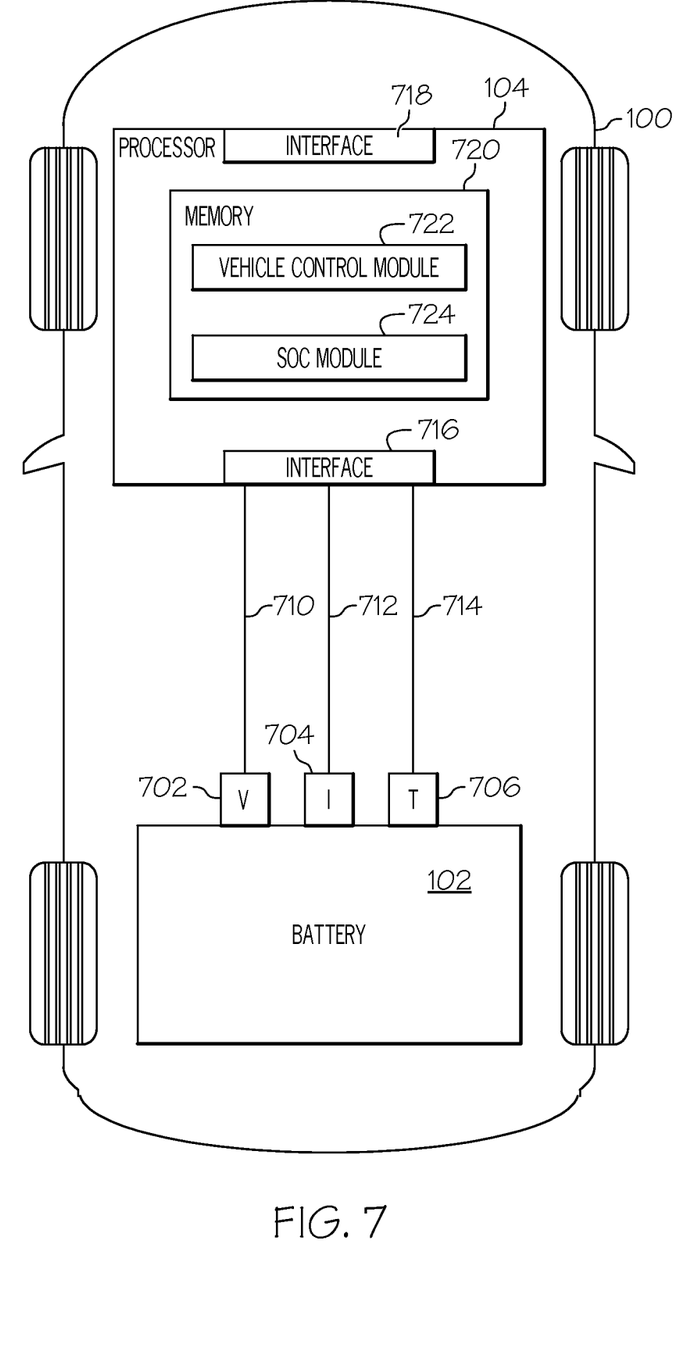
FIG. 7 shows a detailed diagram of the vehicle of FIG. 1.

Referring now to FIG. 7, a detailed diagram of vehicle 100 is shown, according to an exemplary embodiment. Voltage sensor 702 measures the voltage of battery 102 and provides voltage values to interface 716 of controller 104 via bus line 710. Current sensor 704 measures the current of battery 102 and provides current values to interface 716 of controller 104 via bus line 712. Temperature sensor 706 measures the temperature of battery 102 and provides temperature values to interface 716 of controller 104 via bus line 714.

Bus lines 710, 712, and 714 may be any combination of hardwired or wireless connections. For example, bus line 710 may be a hardwired connection to provide voltage readings to controller 104, while bus line 712 may be a wireless connection to provide current readings to controller 104. In some embodiments, bus lines 710, 712 and 714 are part of a shared data line that conveys voltage, current, and temperature values to controller 104. In yet other embodiments, lines 710, 712, and 714 may include one or more intermediary circuits (e.g., other microcontrollers, signal filters, etc.) and provide an indirect connection between sensors 702, 704, 706 and controller 104.

Interface 716 is configured to receive the sensor data from sensors 702, 704 and 706 via lines 710, 712, and 714. For example, interface 716 may include one or more wireless receivers, if any of lines 710, 712, or 714 are wireless connections. Interface 716 may also include one or more wired ports, if any of lines 710, 712, or 714 are wired connections. Interface 716 may also include circuitry configured to digitally sample or filter the sensor data from 702, 704 and 706. For example, interface 716 may sample the voltage data received from voltage sensor 702 via bus line 710 at discrete times (e.g., k, k+1, k+2, etc.) to produce discrete voltage values (e.g., V(k), V(k+1), V(k+2), etc.).

Controller 104 is shown to include memory 720, which may be any form of non-transitory memory capable of storing machine-executable instructions that implement one or more of the functions disclosed herein, when executed by processor 104. For example, memory 720 may be a RAM, ROM, flash memory, hard drive, EEPROM, or any other memory device. In some embodiments, memory 720 includes vehicle control module 722, which provides control over one or more components of vehicle 100. For example, vehicle control module 722 may provide control over the engine of vehicle 100 or provide status condition information (e.g., vehicle 100 is low on fuel, vehicle 100 has an estimated number of miles left to travel based on the present SOC of battery 102, etc.) to one or more display devices in the interior of vehicle 100 via interface 718. In some embodiments, vehicle control module 722 may also communicate with other processing circuits (e.g., an engine control unit, an on-board diagnostics system, etc.) or other sensors (e.g., a mass airflow sensor, a crankshaft position sensor, etc.) via interface 718.

Interface 718 may provide one or more wired or wireless connections between processor 104 and the various systems of vehicle 100. For example, interface 718 may provide a wired connection between processor 104 and a dashboard display and a wireless connection between processor 104 and an on-board diagnostics system. In some embodiments, interface 718 may also provide a wireless connection between processor 104 and other computing systems external to vehicle 100. For example, processor 104 may communicate status condition information to an external server via a cellular, WiFi, or satellite connection. Interface 718 may also include one or more receivers configured to send and receive location information for vehicle 100. For example, interface 718 may include a GPS receiver or cellular receiver that utilizes triangulation to determine the location of vehicle 100.

Memory 720 is further shown to include SOC module 724, which is configured to determine and store the state of charge information for battery 102. SOC module 724 receives battery sensor data from interface 716 and utilizes the sensor data to determine the present SOC of battery 102. SOC module 724 may receive and provide the determined SOC value to vehicle control module 722 or to other electronic devices via interface 718. For example, SOC module 724 may determine that the overall SOC of battery 102 is presently at 65% and provide an indication of this to a charge gauge in the interior of vehicle 100 via interface 718. SOC module 724 may also receive one or more operating parameters via interface 718 from other systems or devices. For example, SOC module 724 may receive data corresponding to a mapping of open-circuit voltages to SOC values for battery 102.

Figure 8:
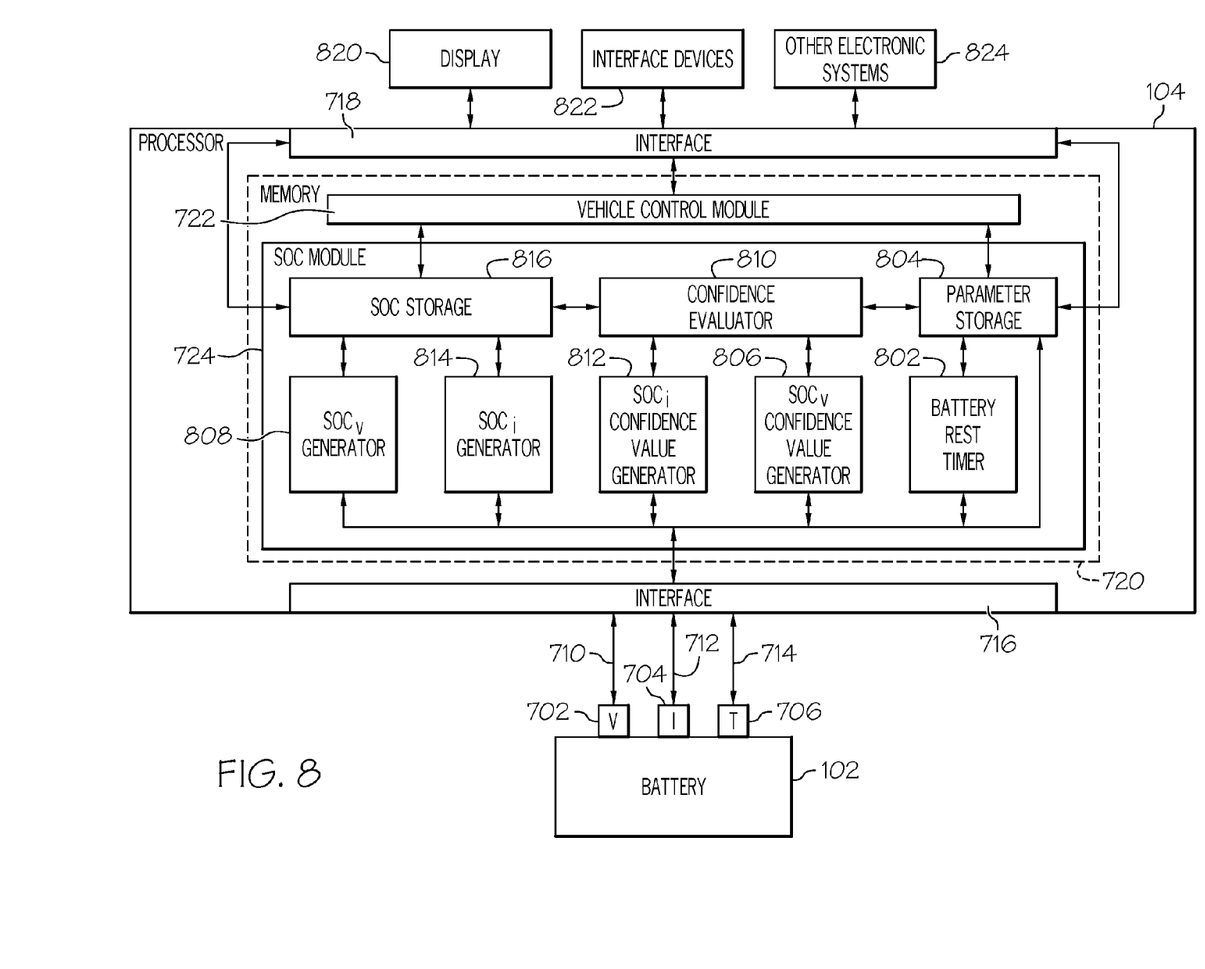
FIG. 8 is a detailed diagram of the SOC module shown in FIG. 7.

Referring now to FIG. 8, a detailed diagram of SOC module 724 is shown, according to an exemplary embodiment. SOC module 724 is shown to include battery rest timer 802, Battery rest timer 802 checks time stamp of battery controller at off and on times and compares them to determine the rest time. In some embodiments, battery rest timer 802 may determine the battery rest time using one or more parameters stored in parameter storage 804. For example, parameter storage 804 may include parameters received from other electronic systems 824 that indicate that the running state of the vehicle. For example, parameter storage 804 may receive an indication from the ignition of vehicle 100 via interface 718 whenever vehicle 100 is turned off or started and store one or more parameters (e.g., time stamps) related to these events.

SOC module 724 is also shown to include SOC_i generator 814 and SOC_i confidence value generator 812. SOC_i generator 814 and SOC_i confidence value generator 812 receive sensor data from sensors 702, 704, and 706 via interface 716. SOC_i generator uses the sensor data and a current-based SOC estimation strategy to generate an SOC_i value. For example, SOC_i generator may solve one or more difference equations that utilize a sensed current value from current sensor 704, a previous SOC estimation stored in SOC storage 816, a battery capacity parameter stored in parameter storage 804, and time information associated with the current value, in order to generate a current-based SOC estimation.

SOC_i confidence value generator 812 determines a confidence value for the current-based SOC estimation generated by SOC_i generator 814. For example, SOC_i confidence value generator 812 may solve one or more difference equations that utilize parameters stored in parameter storage 804, such as a previously determined confidence value, one or more tolerance parameters, a battery capacity parameter, or time information, in order to generate one or more confidence values for the current-based SOC estimation generated by SOC_i generator 814. SOC_i confidence value generator 812 may also use additional parameters such as the amount of discretization noise from sampling current values from current sensor 704 to generate the confidence value. In some embodiments, SOC_i confidence value generator 812 generates multiple confidence values for the current-based SOC estimation, in order to define a confidence range for the current-based SOC estimation. The one or more confidence values generated by SOC_i confidence value generator 812 are provided to confidence evaluator 810 for further evaluation.

SOC module 724 also includes SOC_v generator 808 and SOC_v confidence value generator 806. SOC_v generator 808 and SOC_v confidence value generator 806 receive sensor data from sensors 702, 704, and 706 via interface 716. SOC_v generator 808 uses the sensor data and a voltage-based SOC estimation strategy to generate an SOC_v value. SOC_v generator 808 may operate under one or more modes to generate a voltage-based SOC estimation. For example, SOC_v generator 808 may receive one or more parameters from battery rest timer 802 or from parameter storage 804 that indicate that SOC module 720 requires initialization (e.g., vehicle 100 has been restarted after a period of rest, a manual reinitialization request has been received from one or more interface devices 822, etc.). During initialization mode, SOC_v generator 808 may determine an open-circuit voltage for battery 102 using sensor data received from voltage sensor 702. SOC_v generator 808 may use the calculated open-circuit voltage and one or more voltage-SOC characteristics stored in parameter storage 804 to generate a voltage-based SOC estimation for battery 102.

During initialization mode, SOC_v confidence value generator 806 may utilize rest time data generated by battery rest timer 802, a diffusion time constant value for battery 102 stored in parameter storage 804, a tolerance value for voltage sensor 702 stored in parameter storage 804, and voltage and temperature data received via interface 716, to generate a confidence value for the voltage-based SOC estimation generated by SOC_v generator 808. For example, the confidence value may indicate a low amount of uncertainty associated with the voltage-based SOC estimation, if the amount of time battery 102 has been at rest is sufficient to overcome the effects of diffusion. In such a case, the confidence value may be a pure function of the tolerance of voltage sensor 702. The amount of time necessary for the effects of diffusion to dissipate is dependent on the time constant for battery 102, as well as the temperature data received from temperature sensor 706. Where the effects of diffusion are still present in battery 102, the confidence value generated by SOC_v confidence value generator 806 may be based on the tolerance of voltage sensor 702, as well as a function of the rest time, temperature, and diffusion constant of battery 102. In some embodiments, SOC_v confidence value generator 806 generates one or more confidence values to define an asymmetric range of uncertainty for the voltage-based SOC estimation.

When SOC module 720 is not in an initialization mode, SOC_v generator 808 may utilize a regression technique to determine the voltage-based SOC estimation. For example, SOC_v generator 808 may utilize regression on a previously determined open-circuit voltage value stored in parameter storage 804 and sensor data received via interface 716, in order to determine the voltage-based SOC estimation. If a regression technique is used by SOC_v generator 808 to determine the voltage-based SOC estimation, SOC_v confidence value generator may also use a regression technique and a previously determined confidence value to generate the present voltage-based confidence value.

SOC module 724 is also shown to include confidence evaluator 810, which receives the current-based confidence value generated by SOC_i confidence value generator 812 and the voltage-based confidence value generated by SOC_v confidence value generator 806. Confidence evaluator 810 compares the current-based confidence value and the voltage-based confidence value to determine which SOC estimation has a lower amount of uncertainty. For example, the comparison may be a straight comparison between the confidence values, or may utilize one or more weighting parameters stored in parameter storage 804. Confidence evaluator 810 provides an indication of the comparison to SOC storage 816, which may be used by SOC storage 816 to select the overall SOC estimation. Confidence evaluator 810 may also provide the indication to parameter storage 804 to select between the voltage-based and current-based confidence values as an overall confidence value associated with the overall SOC estimation.

SOC storage 816 utilizes comparison information from confidence evaluator 810 to select between the voltage-based SOC estimation generated by SOC_v generator 808 and the current-based SOC estimation generated by SOC_i generator 814. SOC storage 816 selects the SOC estimation that has the lowest amount of uncertainty and stores it as the overall SOC estimation. SOC storage 816 may also provide the overall SOC estimation to vehicle control module 722, or to display 820, interface devices 822, or other electronic systems 824 via interface 718. For example, SOC storage 816 may provide the overall SOC estimation to display 820, which displays the overall SOC estimation to the driver of vehicle 100 using visual indicia such as a meter, a gauge, or as text. SOC storage 816 may also provide the overall SOC estimation to interface devices 822 (e.g., touch screen devices, voice interactive systems, etc.) to alert the driver of the current state of charge of battery 102. SOC storage 816 may also provide the overall SOC estimation to vehicle control module 722 or to other electronic systems 824 (e.g., a mobile device, a remote server, a microprocessor providing control over other components of vehicle 100, etc.) for further processing.

Many modifications and variations of embodiments of the present invention are possible in light of the above description. The above-described embodiments of the various systems and methods may be used alone or in any combination thereof without departing from the scope of the invention. Although the description and figures may show a specific ordering of steps, it is to be understood that different orderings of the steps are also contemplated in the present disclosure. Likewise, one or more steps may be performed concurrently or partially concurrently.

The various operations of the methods and systems in the present disclosure may be accomplished using one or more processing circuits. For example a processing circuit may be an ASIC, a specific-use processor, or any existing computer processor. One or more steps or functions in the present disclosure may also be accomplished using non-transitory, machine-readable instructions and data structures stored on machine-readable media. For example, such media may comprise a floppy disc, CD-ROM, DVD-ROM, RAM, EEPROM, flash memory, or any other medium capable of storing the machine-executable instructions and data structures and capable of being accessed by a computer or other electronic device having a processing circuit.

What is claimed is:

1. A method for determining a state of charge of a vehicle battery comprising:
   providing a computer-based system comprising an input, an output, a processor, memory and program code comprising at least a confidence evaluator;
   operating the program code such that calculations made thereby are performed by said processor;
   receiving into said system sensor data indicative of a voltage, current, and temperature of the battery;
   determining with said system a first state of charge value using a voltage-based strategy on the sensor data;
   calculating with said system a first confidence value for the first state of charge value;
   determining with said system a second state of charge value using a current-based strategy on the sensor data;
   calculating with said system a second confidence value for the second state of charge value;
   comparing the first confidence value and second confidence value with the confidence evaluator;
   selecting between the first state of charge value and the second state of charge value based on the comparison; and
   storing the selected state of charge value in said system as an overall state of charge value.

2. The method of claim 1, wherein the first confidence value is calculated using the tolerance of a voltage sensor, the rest time of the battery, and the diffusion constant of the battery.

3. The method of claim 1, wherein the second confidence value is calculated using the tolerance of a current sensor.

4. The method of claim 1, further comprising providing the overall state of charge value to a display device.

5. The method of claim 1, wherein the voltage-based strategy uses linear regression to determine an open circuit voltage value.

6. The method of claim 1, further comprising calculating an asymmetric confidence range for the first state of charge value based in part on the first confidence value.

7. A system for determining a state of charge of a vehicle battery comprising:
   an interface configured to receive sensor data from a voltage sensor, a current sensor, and a temperature sensor connected to the battery;
   a voltage-based state of charge generator configured to generate a first state of charge value using a voltage-based strategy on the sensor data;
   a voltage-based confidence value generator configured to calculate a first confidence value for the first state of charge value;
   a current-based state of charge generator configured to generate a second state of charge value using a current-accumulation strategy on the sensor data;
   a current-based confidence value generator configured to calculate a second confidence value for the second state of charge value;
   a confidence value evaluator configured to compare the first confidence value and second confidence value, and
   a state of charge storage configured to store the first or the second state of charge value as an overall state of charge value, based on the comparison.

8. The system of claim 7, further comprising:
   a battery rest timer configured to determine a rest time of the battery; and
   wherein the voltage-based confidence value generator is configured to calculate the first confidence value using a tolerance of the voltage sensor, the rest time of the battery, and a diffusion constant of the battery.

9. The system of claim 8, wherein the current-based confidence value generator is configured to calculate the second confidence value using a tolerance of the current sensor.

10. The system of claim 7, further comprising an interface configured to provide the overall state of charge value to a display device.

11. The system of claim 7, wherein the voltage-based state of charge generator uses linear regression to determine the first state of charge value.

12. The system of claim 7, wherein the voltage-based state of charge generator uses a direct voltage measurement to determine the first state of charge value.

13. The system of claim 7, wherein the voltage-based state of charge generator uses both linear regression and a direct voltage measurement to determine the first state of charge value.

14. A system for determining a state of charge of a vehicle battery comprising:
   a vehicle battery;
   a temperature sensor configured to measure a temperature of the battery;
   a current sensor configured to measure a current of the battery;
   a voltage sensor configured to measure a voltage of the battery;
   a memory storing one or more state of charge values for the battery; and
   a processor coupled to the memory and configured to:
      receive sensor data from the sensors indicative of a voltage, current, and temperature of the battery;
      determine a first state of charge value using a voltage-based strategy on the sensor data;
      calculate a first confidence value for the first state of charge value;
      determine a second state of charge value using a current-based strategy on the sensor data;
      calculate a second confidence value for the second state of charge value;
      compare the first confidence value and second confidence value;
      select between the first state of charge value and the second state of charge value based on the comparison; and
      store the selected state of charge value in the memory as an overall state of charge value.

15. The system of claim 14, wherein the memory further stores a tolerance of the voltage sensor, a rest time of the battery, and a diffusion constant of the battery; and wherein the processor is further configured to calculate the first confidence value using the tolerance of the voltage sensor, the rest time of the battery, and the diffusion constant of the battery.

16. The system of claim 14, wherein the memory further stores a tolerance of the current sensor; and wherein the processor is further configured to calculate the second confidence value using the tolerance of the current sensor.

17. The system of claim 14, wherein the processor is further configured to provide the overall state of charge value to a display device.

18. The system of claim 14, wherein the voltage-based strategy uses linear regression to determine the first state of charge value.

19. The system of claim 14, wherein the processor is further configured to determine an asymmetric confidence range for the first and the second state of charge value, and configured to use the asymmetric confidence range to select between the first state of charge value and the second state of charge value.

20. The system of claim 14, wherein the battery is a lithium-iron-phosphate battery.

* * * * *